United States Patent
Beamish et al.

(10) Patent No.: US 11,573,594 B2
(45) Date of Patent: Feb. 7, 2023

(54) METHODS AND APPARATUSES FOR PROVIDING A REFERENCE CLOCK SIGNAL

(71) Applicant: u-blox AG, Thalwil (CH)

(72) Inventors: Norman Beamish, Cork (IE); Brian Morley, Cork (IE)

(73) Assignee: U-BLOX AG, Thalwil (CH)

( * ) Notice: Subject to any disclaimer, the term of this patent is extended or adjusted under 35 U.S.C. 154(b) by 0 days.

(21) Appl. No.: 17/373,322

(22) Filed: Jul. 12, 2021

(65) Prior Publication Data

US 2023/0011122 A1 Jan. 12, 2023

(51) Int. Cl.
*G06F 1/08* (2006.01)
*H03B 5/36* (2006.01)

(52) U.S. Cl.
CPC ............... *G06F 1/08* (2013.01); *H03B 5/36* (2013.01)

(58) Field of Classification Search
CPC . H03L 7/16; H03L 7/18; H03L 7/1974; H03L 7/06; H03L 7/099; H03L 7/081; H03L 7/10; H03L 7/093; H03L 7/183; H03L 7/0891; H03L 7/08; H03L 7/091; H03K 5/1252; H03D 7/165; H04B 1/0475; H04B 15/06; H04B 15/04; H04B 1/30; H04B 1/406; H04B 1/109; H04B 1/10; H04B 1/28; G06F 1/08; G06F 1/022; H03B 5/36
See application file for complete search history.

(56) References Cited

U.S. PATENT DOCUMENTS

| | | | | |
|---|---|---|---|---|
| 7,581,132 | B2* | 8/2009 | Plourde | G06F 1/08 331/46 |
| 8,020,026 | B1* | 9/2011 | Khlat | G06F 1/08 713/600 |
| 9,386,521 | B2* | 7/2016 | Hu | H04L 7/0331 |
| 2009/0305643 | A1 | 12/2009 | Sayers et al. | |
| 2011/0012663 | A1* | 1/2011 | Crowley | G06F 1/04 327/299 |

OTHER PUBLICATIONS

"Implementing Clock Switchover in Stratix & Stratix GX Devices", Altera Corporation AN-313-1.0, Jan. 2004, 16 pages.

* cited by examiner

*Primary Examiner* — John W Poos
(74) *Attorney, Agent, or Firm* — Finnegan, Henderson, Farabow, Garrett & Dunner LLP

(57) ABSTRACT

A method for providing a reference clock signal, comprising: generating, by an oscillator, a first clock signal having a first frequency, the first clock signal being coupled to a frequency synthesizer; generating, by the frequency synthesizer, a second clock signal based on the first clock signal, the second clock signal having a second frequency different from the first frequency; outputting a reference clock signal to one or more components of an electronic device, the reference clock signal being one of the first clock signal or the second clock signal; identifying one or more spurious frequency components; and monitoring the reference clock signal for a presence of the one or more spurious frequency components, the monitoring comprising: in response to determining the presence of at least one of the one or more spurious frequency components, selecting a different one of the first clock signal or the second clock signal to be the reference clock signal.

17 Claims, 3 Drawing Sheets

METHODS AND APPARATUSES FOR PROVIDING A REFERENCE CLOCK SIGNAL

TECHNICAL FIELD

Apparatuses and methods consistent with the present disclosure relate to providing a clock signal.

BACKGROUND

An electronic device, such as a radio frequency (RF) transceiver, may be designed to operate at a specific operating frequency or frequencies. However, it is a common situation that signals may be present at other frequencies in the electronic device. In some situations, these signals may be interference or spurious signals, which may be harmful to normal operation of the device. As used herein, spurious signals may be signals that negatively affect the operation of the RF transceiver. For example, signals having frequencies that are harmonics of the operating frequencies may be spurious signals.

Sources of the spurious signals may vary. The spurious signals may originate from outside the device or be produced by one or more components of the device. In some cases, spurious signals may be produced by interactions between different components of the device. When individual components are designed or manufactured, it may not be possible to predict all of the possible interactions with other components, thus spurious signal production may not be foreseeable until all components are integrated into the electronic device.

Prior methods of eliminating spurious signals involve redesigning components of the device after spurious signals are discovered, which may be an iterative process of redesigning and testing that can be time consuming and expensive.

SUMMARY

In accordance with the present disclosure, there is provided a method for generating a reference clock signal, comprising: generating, by an oscillator, a first clock signal having a first frequency, the first clock signal being coupled to a frequency synthesizer; generating, by the frequency synthesizer, a second clock signal based on the first clock signal, the second clock signal having a second frequency different from the first frequency; outputting a reference clock signal to one or more components of an electronic device, the reference clock signal being one of the first clock signal or the second clock signal; identifying one or more spurious frequency components; monitoring the reference clock signal for presence of the one or more spurious frequency components, wherein when the reference clock signal includes at least one of the one or more spurious frequency components based on the monitoring, selecting a different one of the first clock signal or the second clock signal to be the reference clock signal.

In accordance with another embodiment of the present disclosure, there is also provided a radio transceiver, comprising: an oscillator configured to generate a first clock signal having a first frequency; a frequency synthesizer, coupled to receive the first clock signal and generate, based on the first clock signal, a second clock signal having a second frequency; one or more multiplexers coupled to receive the first clock signal and the second clock signal; one or more components coupled to receive respective outputs of the one or more multiplexers; and one or more processors configured to execute steps of: identifying one or more spurious frequency components in the reference clock signal; causing the one or more multiplexers to select one of the first clock signal or the second clock signal as a reference clock signal for output; monitoring the reference clock signal for presence of the one or more spurious frequency components, wherein when the reference clock signal includes at least one of the one or more spurious frequency components based on the monitoring, causing the one or more multiplexers to select a different one of the first clock signal or the second clock signal to be the reference clock signal.

DETAILED DESCRIPTION

References will now be made in detail to exemplary embodiments, examples of which are illustrated in the accompanying drawings. The following description refers to the accompanying drawings in which the same numbers in different drawings represent the same or similar elements unless otherwise specified. The implementations set forth in the following disclosure are consistent with aspects related to the invention as recited in the appended claims.

Figure 1:
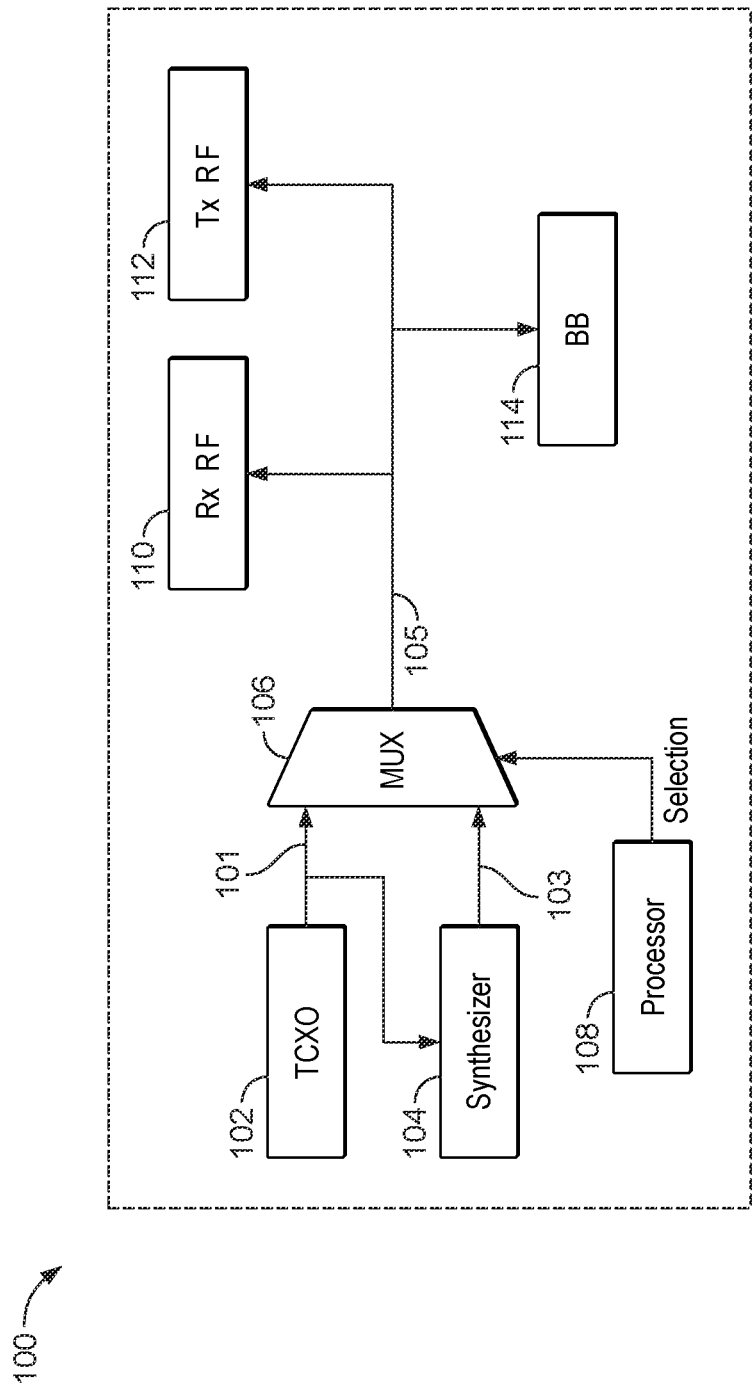
FIG. 1 depicts a schematic diagram of exemplary circuitry of a transceiver device, consistent with disclosed embodiments.

FIG. 1 depicts a schematic diagram of exemplary circuitry of a transceiver device, consistent with the disclosed embodiments. FIG. 1 depicts a transceiver 100 including a temperature compensated crystal oscillator (TCXO) 102, a synthesizer 104, a multiplexer 106, a processor 108, RF receiving (Rx RF) components 110, RF transmitting (Tx RF) components 112, and baseband (BB) components 114. Transceiver 100 may be a radio transceiver, or any other such transceiver suitable for transmitting and/or receiving signals in different frequency bands. In some embodiments, the RF receiving components 110 or the RF transmitting components 112 may be absent. In other words, in some embodiments transceiver 100 may act as a RF receiver, i.e., perform no transmitting functions, or act as a RF transmitter, i.e., perform no receiving functions.

An oscillator is provided in transceiver 100, such as a crystal oscillator. TCXO 102 may be a crystal oscillator having characteristics that do not vary significantly with different temperature. For example, TCXO 102 may maintain a relatively constant output (e.g., frequency of oscillation) over a range of temperature variations or fluctuations. Examples of temperature variation or fluctuation may include a rise in temperature due to heating caused by device operation, or a change in the temperature of the external environment. In some embodiments, TCXO 102 may include one or more circuits in its oscillation loop to compensate for the frequency-temperature characteristics of its crystal component. TCXO 102 generates a clock signal 101 as a first clock signal having a first frequency. In the context of digital circuits, a clock signal refers to an electrical signal that oscillates between two states (e.g., energy, voltage, or power levels) of a high and a low state, configured to coordinate actions and functions of the digital circuit. For example, a clock signal may be a square wave with a 50% duty cycle, with a fixed, constant frequency. Clock signal 101 is coupled to synthesizer 104 and multiplexer 106.

Synthesizer 104 may be provided as part of a frequency synthesizer. A frequency synthesizer is an electronic circuit that is capable of generating a range of output frequencies from one or more single input frequencies. Synthesizer 104 is coupled to receive clock signal 101 as an input and provide a second clock signal 103 having a second frequency as an output to multiplexer 106. In some embodiments, synthesizer 104 may generate clock signal 103 based on clock signal 101 by way of frequency multiplication, frequency division, direct digital synthesis, frequency mixing, one or more phase-locked loops, and/or other signal processing methods known in the art. Additionally or alternatively, clock signal 103 may include a plurality of signals each having a different frequency. For example, synthesizer 104 may generate more than one signal, each having a different frequency. Examples of frequency synthesizer 104 may include, but are not limited to, a phase-locked loop (PLL) or an all-digital phase locked loop (ADPLL).

Multiplexer 106 is coupled to receive clock signal 101 and clock signal 103 and is configured to select one of clock signal 101 and clock signal 103 to output as clock signal 105. Clock signal 105 may be an example of a reference clock signal. Multiplexer 106 is coupled to output clock signal 105 to various components of transceiver 100 that require a clock signal, such as Rx RF components 110, Tx RF components 112, and/or BB components 114. In some embodiments, multiplexer 106 performs the selection based on a selection signal received from processor 108. As noted above, clock signal 103 may include a plurality of signals, and multiplexer 106 may select more than one of clock signals 103 as clock signal 105, which may also include more than one clock signal. For example, clock signal 105 may include a first reference clock signal having a first reference clock frequency coupled to Rx RF components 110, a second reference clock signal having a second reference clock frequency coupled to Tx RF components 112, and a third reference clock signal having a third reference clock frequency coupled to BB components 114. In some embodiments, multiplexer 106 may include a plurality of multiplexers.

Rx RF components 110 and Tx RF components 112 may each include various components, such as antennas, filters, converters, mixers, amplifiers, and other RF circuitry for receiving and transmitting signals at the RF frequency. Base Band (BB) components 114 refer to various components, such as filters, converters, mixers, amplifiers, decoder/encoders, modulator, equalizer, and RF circuitry for processing signals at the base band frequency.

Processor 108 may be any circuit(s) capable of executing commands or instructions to carry out desired functions, such as a processor, micro-controller, logic arrays, or other control circuit. Though not shown in FIG. 1, processor 108 may provide control and/or command signals to other components of transceiver 100 and be configured to carry out calculations or processing based on programming. In some embodiments, processor 108 generates a selection signal to multiplexer 106 for selecting and/or switching the reference clock signal. In some embodiments, processor 108 receives inputs from various components of transceiver 100 (not shown) and generates the selection signal based on the received inputs. For example, processor 108 may receive inputs such as programmed instructions or stored data from one or more memory units (not shown) of transceiver 100. Additionally, processor 108 may receive as inputs, various parameters of transceiver 100, such as sample outputs of different components of transceiver 100. The operations of processor 108 for generating the selection signal are discussed below with reference to FIG. 2.

Figure 2:
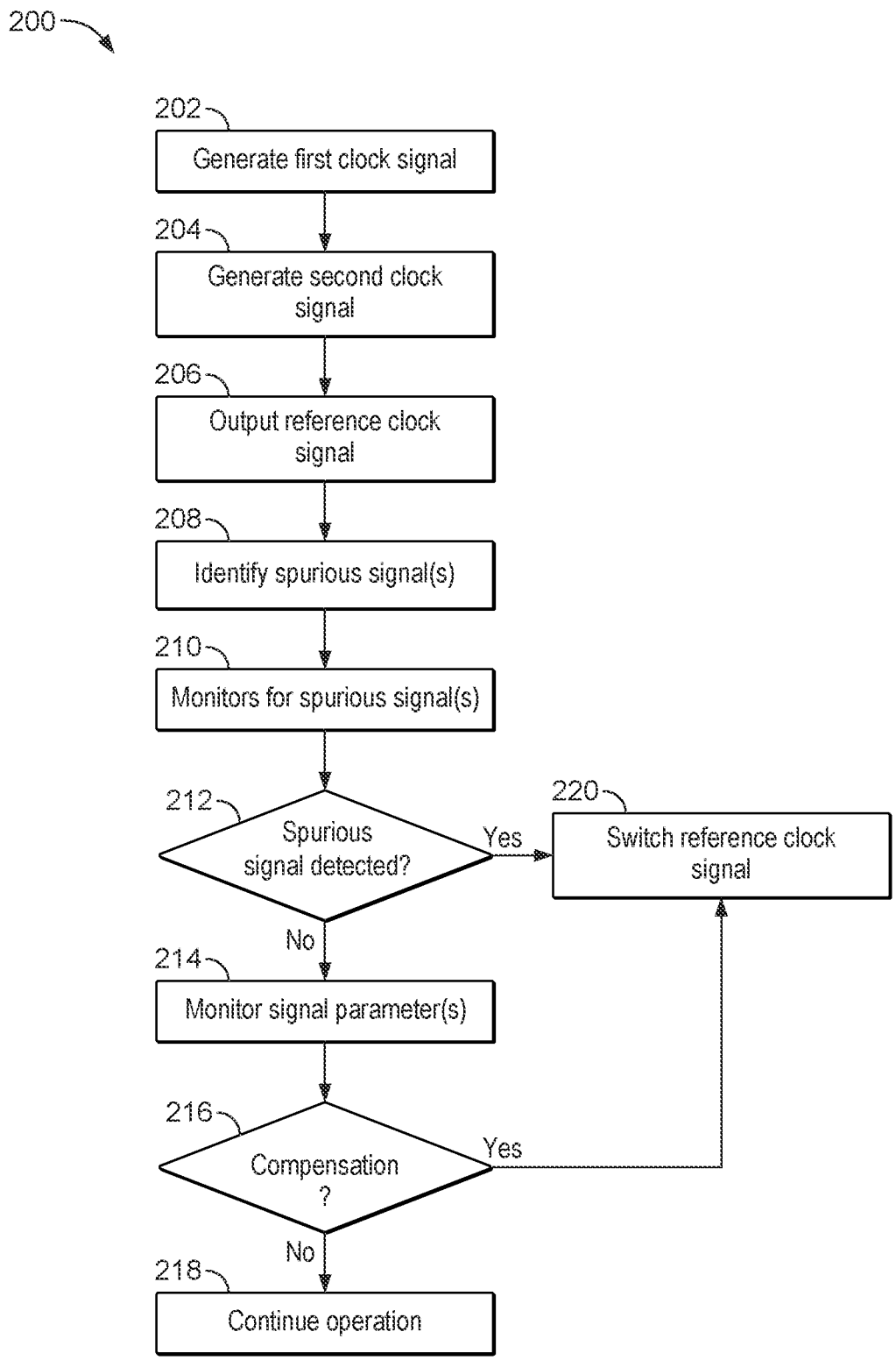
FIG. 2 depicts a flow chart depicting an exemplary process for selecting and switching a reference clock signal, consistent with disclosed embodiments.

FIG. 2 depicts a flow chart of an exemplary process 200 for selecting and switching a reference clock signal, consistent with disclosed embodiments. In some embodiments, process 200 may be performed by processor 108 of transceiver 100. For example, processor 108 may perform process 200 during normal operation of transceiver 100.

In step 202, an oscillator, such as TCXO 102 of transceiver 100 generates a first clock signal, e.g., clock signal 101, the first clock signal having a first frequency.

In step 204, a synthesizer, e.g., synthesizer 104, generates a second clock signal, e.g., clock signal 103, the second clock signal having a second frequency.

In step 206, multiplexer 106 outputs a reference clock signal. In some embodiments, multiplexer 106 is coupled to receive clock signal 101 and clock signal 103 and is configured to select one of clock signal 101 and clock signal 103 to output as reference clock signal 105. Multiplexer 106 performs the selection based on a signal received from one or more processors or micro-control circuitry, e.g., processor 108. For example, processor 108 may execute one or more algorithms or codes to determine which one of clock signal 101 or clock signal 103 to select as reference clock signal 105, and control multiplexer 106 to make the determined selection. In some embodiments, processor 108 may cause multiplexer 106 to select clock signal 101 by default as reference clock signal 105. Since clock signal 101 is produced by an oscillator (e.g., TCXO 102), it may contain fewer noise components than a signal produced by a synthesizer (e.g., synthesizer 104), so absent particular circumstances, such as the presence of particular spurious or interference signals, selection of clock signal 101 as reference clock signal 105 may be preferable over selection of clock signal 103.

In step 208, processor 108 identifies one or more spurious signals. Spurious signals, as previously described, are signals or signal components, from both within the electronic device (such as transceiver 100) and outside the electronic device (e.g., received from other sources). Processor 108 is programmed to identify such spurious signals so as to mitigate negative effects of such signals on the operation of transceiver 100. For example, processor 108 may be programmed to identify the presence of spurious signals based on one or more spurious frequency components in a received signal or a detected sample signal.

In some embodiments, processor 108 identifies spurious signals based on information stored in the one or more memory units. Spurious signals may be identified by prior testing and stored in a table or list in one or more memory units. For example, a designer or an operator may, based on the circuit design of transceiver 100 (such as frequency TCXO 102 or synthesizer 104), determine that signals with certain frequencies have a high probability of being spurious signals. These frequencies may be examples of spurious frequency components. In some non-limiting examples, signals having frequencies that are harmonics of the clock frequency (e.g., the frequency of clock signal 101 or clock signal 103) may be spurious signals. In other words, signals at a frequency of double, treble or some other multiple of the frequency of clock signal 101 or clock signal 103 may be deemed as a spurious signal. Accordingly, processor 108 may retrieve the stored data regarding spurious signals to identify spurious signals in step 208.

In some embodiments, processor 108 may alternatively or additionally identify spurious signals based on the operation of transceiver 100. In some instances, signals having frequencies that are harmonics of the frequency of the received RF signal or transmitted RF signal may also be spurious signals. For example, processor 108 may have prior knowledge of the nominal frequency of the TCXO 102 and the operating frequency/frequencies of synthesizer 104. The prior knowledge data may be stored in the one or more memory units of transceiver 100 and accessed by processor 108. Accordingly, processor 108 may identify signals that are harmonics of the received RF signal or transmitted RF signal as spurious signals. Furthermore, since the frequency of clock signal 101 may be a different frequency than the frequency of clock signal 103, processor 108 may identify signals having harmonics of the frequency clock signal 101 as spurious signals when clock signal 101 is selected as the reference clock signal and may identify signals having harmonics of the frequency clock signal 103 as spurious signals when clock signal 103 is selected as the reference clock signal.

In step 210, processor 108 monitors for one or more spurious signals. In some embodiments, processor 108 actively monitors operations of transceiver 100 to look for the presence of one or more spurious signals identified in step 208. In some embodiments, processor 108 may sample outputs at different components of transceiver 100 and compare the frequency components of the samples against those of the spurious signals. For example, one or more detectors may be configured to detect signals outputted by different components of transceiver 100 and provide the frequency components of these detected sample signal as inputs to processor 108 to compare with those of the spurious signals identified in step 208.

In step 212, if processor 108 detects the presence of at least one of the one or more spurious signals (i.e., step 212-Yes), processor 108 causes multiplexer 106 to switch the selection of reference clock signal (step 220). For example, if multiplexer 106 previously selected clock signal 101 as the reference clock signal 105, then processor 108 causes multiplexer 106 to change the selection to clock signal 103 as the new reference clock signal 105 via the selection signal. If processor 108 does not detect the presence of spurious signal (i.e., step 212-No), process 200 proceeds to step 214. In other words, if no spurious signal is present, transceiver 100 proceeds to operate as before, i.e., without any change to the selected clock signal as the reference clock signal 105.

In step 214, processor 108 monitors one or more signal parameters. As used herein, a signal parameter refers to a characteristic or property of a signal, such as a received or transmitted RF signal. Examples of signal parameters include amplitude, power, frequency, bandwidth, phase, lock-status, bit error rate, and other similar characteristics or properties of a signal in an electronic device. In some embodiments, processor 108 may sample the outputs of one or more components of transceiver 100 and compare values of one or more parameters of the sampled outputs to reference values. For example, one or more detectors may be configured to detect signals output by different components of transceiver 100 or may be configured to calculate values of one or more parameters of the detected signal. Each reference value may be a value stored in the one or more memory units of transceiver 100. For example, processor 108 may sample the output of BB 114 to monitor if the bit-error rate deviates from a reference value. If the bit-error rate undesirably deviates from the reference value by a threshold value, it may be the case that interferences present cause the undesired deviation.

In step 216, processor 108 determines whether compensation or mitigating action is needed based on the monitoring of step 214. In some embodiments, if the monitored parameter deviates from a reference value by a threshold amount (i.e., step 216-Yes), processor 108 may cause multiplexer 106 to change the selection of reference clock signal 105 in step 220. If the monitored parameter does not deviate from a reference value by a threshold amount (i.e., step 216-No), transceiver 100 continues to operate as before (step 218).

Figure 3:
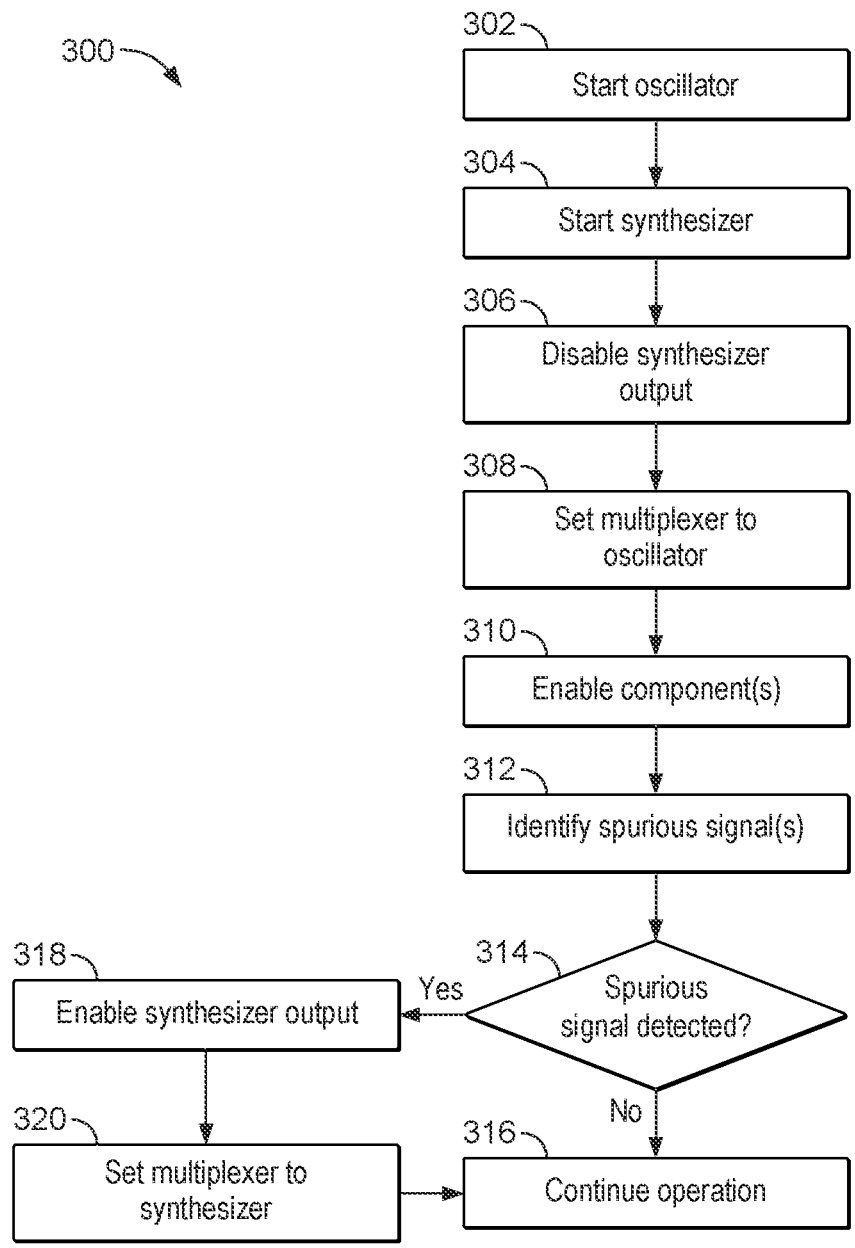
FIG. 3 depicts a flow chart of an exemplary process for selecting and switching a reference clock signal, consistent with disclosed embodiments.

FIG. 3 depicts a flow chart of an exemplary process 300 for selecting and switching reference clock signal 105, consistent with disclosed embodiments. In some embodiments, process 300 may be carried out during a start-up process of transceiver 100. For example, processor 108 may perform process 300 when transceiver 100 is powering up. Start-up process as used herein may refer to a process of powering up an electronic device.

In step 302, an oscillator (such as TCXO 102) is started. For example, a dedicated power-on circuit of transceiver 100 (not shown) may initiate TCXO 102 from OFF mode by causing transceiver 100 to supply power to TCXO 102. In some embodiments, processor 108 may indirectly start TCXO 102 when emerging from SLEEP mode by setting up the WAKE conditions prior to entering SLEEP mode, e.g., by activating a timer (counter).

In step 304, a synthesizer (such as synthesizer 104) is started. For example, the dedicated power-on circuit of transceiver 100 may initiate synthesizer 104 from OFF mode by causing transceiver 100 to supply power to synthesizer 104. In some embodiments, processor 108 may indirectly start synthesizer 104 when emerging from SLEEP mode by setting up the WAKE conditions prior to entering SLEEP mode, e.g., by activating a timer (counter). In some embodiments, TCXO 102 can be powered up substantially at the same time as synthesizer 104, before synthesizer 104, or after synthesizer 104.

In step 306, processor 108 disables output of synthesizer 104. As previously described, in some instances, clock signal 101 may be preferable as a reference clock over clock signal 103.

In step 308, processor 108 causes multiplexer 106 to select the output of TCXO 102 as the reference clock signal. For example, processor 108 may initially select clock signal 101 from TCXO 102 to be reference clock signal 105.

In step 310, processor 108 enables one or more other components of transceiver 100, such Rx RF components 110, Tx RF components 112, and BB components 114. For example, processor 108 may initialize the various components of transceiver 100.

In step 312, processor 108 identifies one or more spurious signals. In some embodiments, processor 108 may carry out operations similar to the ones previously described with reference to step 208 in FIG. 2. For example, processor 108 identifies spurious signals based on information stored in the one or more memory units of transceiver 100, such as information regarding signals with certain frequencies having a high probability of being spurious signals. In some embodiments, since clock signal 101 is initially selected to be reference clock signal 105 in step 308, processor 108 identifies one or more signals having frequencies that are harmonics of clock signal 101 as spurious signals.

In step 314, if processor 108 detects the presence of spurious signals identified in step 312 (i.e., step 314-Yes), process 300 proceeds to step 318. If processor 108 does not detect spurious signals identified in step 312 (i.e., step 314-No), process 300 proceeds to step 316.

In step 316, transceiver 100 continues to operate after powering up, using reference clock 105 selected in step 308 as its clock signal.

In step 318, processor 108 enables the output of synthesizer 104. In some embodiments, once it is determined that a spurious signal is present in step 314, transceiver 100 may operate in a better condition using a different clock signal. Accordingly, processor 108 may then enable synthesizer 104 to output clock signal 103.

In step 320, processor 108 causes multiplexer 106 to switch the selection of reference clock signal 105 in step 308. For example, processor 108 causes multiplexer 106 to select clock signal 103 as reference clock signal 105. Process 300 then proceeds to step 316, using clock signal 103 as reference clock signal 105 to operate the various components of transceiver 100.

The one or more memory units of the present disclosure may be a tangible device that can store instructions for use by an instruction execution device, such as a processor described above. The one or more memory units may be, for example, but are not limited to, an electronic storage device, a magnetic storage device, an optical storage device, an electromagnetic storage device, a semiconductor storage device, or any suitable combination of the foregoing. A non-exhaustive list of more specific examples of memory includes the following: a portable computer diskette, a hard disk, a random access memory (RAM), a read-only memory (ROM), an erasable programmable read-only memory (EPROM), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing.

The computer-readable program instructions of the present disclosure, such as any software modules or algorithms executable by a processor, may be assembler instructions, instruction-set-architecture (ISA) instructions, machine instructions, machine-dependent instructions, microcode, firmware instructions, state-setting data, or source code or object code written in any combination of one or more programming languages, including an object-oriented programming language, and conventional procedural programming languages. The computer-readable program instructions may execute entirely on a computing device as a stand-alone software package, or partly on a first computing device and partly on a second computing device remote from the first computing device. In the latter scenario, the second, remote computing device may be connected to the first computing device through any type of network, including a local area network (LAN) or a wide-area network (WAN).

The flowcharts and block diagrams in the figures illustrate examples of the architecture, functionality, and operation of possible implementations of systems, methods, and devices according to various embodiments. It should be noted that, in some alternative implementations, the functions noted in blocks may occur out of the order noted in the figures. For example, two blocks shown in succession may, in fact, be executed substantially concurrently, or the blocks may sometimes be executed in the reverse order, depending upon the functionality involved.

It is understood that the described embodiments are not mutually exclusive, and elements, components, materials, or steps described in connection with one example embodiment may be combined with, or eliminated from, other embodiments in suitable ways to accomplish desired design objectives.

Reference herein to "some embodiments" or "some exemplary embodiments" means that a particular feature, structure, or characteristic described in connection with the embodiment can be included in at least one embodiment. The appearance of the phrases "one embodiment" "some embodiments," "another embodiment" or "alternative embodiment" in various places in the present disclosure do not all necessarily refer to the same embodiment, nor are separate or alternative embodiments necessarily mutually exclusive of other embodiments.

It should be understood that the steps of the example methods set forth herein are not necessarily required to be performed in the order described, and the order of the steps of such methods should be understood to be merely an example.

As used in the present disclosure, the word "exemplary" is used herein to mean serving as an example, instance, or illustration. Any aspect or design described herein as "exemplary" is not necessarily to be construed as preferred or advantageous over other aspects or designs. Rather, use of the word is intended to present concepts in a concrete fashion.

As used in the present disclosure, unless specifically stated otherwise, the term "or" encompasses all possible combinations, except where infeasible. For example, if it is stated that a database may include A or B, then, unless specifically stated otherwise or infeasible, the database may include A, or B, or A and B. As a second example, if it is stated that a database may include A, B, or C, then, unless specifically stated otherwise or infeasible, the database may include A, or B, or C, or A and B, or A and C, or B and C, or A and B and C.

Additionally, the articles "a" and "an" as used in the present disclosure and the appended claims should generally be construed to mean "one or more" unless specified otherwise or clear from context to be directed to a singular form.

Unless explicitly stated otherwise, each numerical value and range should be interpreted as being approximate as if the word "about" or "approximately" preceded the value of the value or range.

Although the elements in the following method claims, if any, are recited in a particular sequence, unless the claim recitations otherwise imply a particular sequence for implementing some or all of those elements, those elements are not necessarily intended to be limited to being implemented in that particular sequence.

It is appreciated that certain features of the present disclosure, which are, for clarity, described in the context of separate embodiments, may also be provided in combination in a single embodiment. Conversely, various features of the specification, which are, for brevity, described in the context of a single embodiment, may also be provided separately or in any suitable sub-combination or as suitable in any other described embodiment of the specification. Certain features described in the context of various embodiments are not essential features of those embodiments, unless noted as such.

It will be further understood that various modifications, alternatives and variations in the details, materials, and arrangements of the parts which have been described and illustrated in order to explain the nature of described embodiments may be made by those skilled in the art without departing from the scope. Accordingly, the following claims embrace all such alternatives, modifications and variations that fall within the terms of the claims.

What is claimed is:

1. A method for providing a reference clock signal, comprising:
   generating, by an oscillator, a first clock signal having a first frequency, the first clock signal being coupled to a frequency synthesizer;
   generating, by the frequency synthesizer, a second clock signal based on the first clock signal, the second clock signal having a second frequency different from the first frequency;
   outputting a reference clock signal to one or more components of are electronic device, the reference clock signal being one of the first clock signal or the second clock signal;
   identifying one or more spurious frequency components, wherein identifying the one or more spurious frequency components comprises: identifying the presence of a spurious signal based on the one or more spurious frequency components in a received signal, wherein the spurious signal is a signal having a frequency matching a harmonic multiple of the reference clock signal; and
   monitoring the reference clock signal fora presence of the one or more spurious frequency components, the monitoring comprising; in response to determining the presence of at least one of the one or more spurious frequency components, selecting a different one of the first clock signal of the second clock signal to be the reference clock signal.

2. A method for providing a reference clock signal, comprising:
   generating, by an oscillator, a first clock signal having frequency, the first clock signal being coupled to a frequency synthesizer;
   generating, by the frequency synthesizer, a second clock signal based on the first clock signal, the second clock signal having a second frequency different from the first frequency;
   outputting a reference clock signal to one or more components of an electronic device, the reference clock signal being one of the first clock signal or the second clock signal;
   identifying one or more spurious frequency components, wherein identifying the one or more spurious frequency components comprises: receiving values of predetermined frequencies corresponding to the one or more spurious frequency components and stored in a memory unit; and
   monitoring the reference clock signal for a presence of the one or more spurious frequency components, the monitoring comprising: in response to determining the presence of at least one of the one or more spurious frequency components, selecting a different one of the first clock signal or the second clock signal to be the reference clock signal.

3. The method of claim 1, further comprising:
   monitoring one or more parameters of a received signal;
   determining whether compensation is needed based on the one or more parameters; and
   changing the reference dock signal to a different one of the first clock signal or the second clock signal based on the determination.

4. The method of claim 3, wherein the one or more parameters includes a bit-error rate.

5. The method of claim 4, wherein the compensation is determined to be needed when the bit-error rate exceeds a predetermined threshold.

6. The method of claim 1, further comprising powering up the electronic device by:
   supplying power to the oscillator;
   supplying power to the frequency synthesizer;
   disabling the output of the frequency synthesizer;
   selecting the first clock signal as the reference clock signal; and
   enabling the one or more components of the electronic device with the reference clock signal.

7. The method of claim 6, wherein when the reference clock signal includes at least one of the one or more spurious frequency components:
   enabling the output of the frequency synthesizer; and
   selecting the second clock signal as the reference clock signal.

8. The method of claim 1, wherein the one or more components comprise base band components and RF components and the second clock signal comprises one or more second clock signals, and selecting the second clock signal further comprises:
   selecting one of the one or more second clock signals for outputting to the base band components; and
   selecting a different one of the one or more second clock signals for outputting to the RF components.

9. An apparatus comprising:
   an oscillator configured to generate a first clock signal having a first frequency;
   a frequency synthesizer, coupled to receive the first clock signal and configured to generate, based on the first clock signal, a second clock signal having a second frequency, wherein the frequency synthesizer is an all-digital phase locked loop (ADPLL);
   at least one multiplexer configured to receive the first clock signal and the second clock signal and output the first clock signal or the second clock signal as a reference clock signal;
   one or more components configured to receive the reference clock signal output from the at least one multiplexer; and
   one or more processors configured to:
      identify one or more spurious frequency components in the reference clock signal;
      control the at least one multiplexer to select one of the first clock signal or the second clock signal as a reference clock signal; and
      monitor the reference clock signal for a presence of the one or more spurious frequency components, the monitoring comprising: in response to determining the presence of at least one the one or more spurious frequency components, causing the at least one multiplexer to select a different one of the first clock signal or the second clock signal to be the reference clock signal.

10. The apparatus of claim 9, wherein the oscillator is a temperature-controlled crystal oscillator (TCXO).

11. The apparatus of claim 9, wherein the one or more processors are further configured to:
   identify the presence of a spurious signal based on the one or more spurious frequency components in a received signal, wherein the spurious signal is a signal having a frequency matching a harmonic multiple of the reference clock signal.

12. The apparatus of claim 9, wherein the one or more processors are further configured to:
   receive values of predetermined frequencies that correspond to the one or more spurious frequency components and are stored in a memory unit.

13. The apparatus of claim 9, wherein the one or more processors are further configured to:
   monitor one or more parameters of a received signal;
   determine if compensation is needed based on the one or more parameters; and
   select a different one of the first clock signal or the second clock signal to be the reference clock signal.

14. The apparatus of claim 13, wherein the one or ore parameters includes a bit-error rate.

15. The apparatus of claim 14, the one or more processors are configured to determine the compensation is needed when the bit-error rate exceeds a predetermined threshold.

16. The apparatus of claim 9, the apparatus is powered up by a process of:
   supplying power to the oscillator;
   supplying power to the frequency synthesizer;
   disabling the output of the frequency synthesizer;
   selecting the first clock signal as the reference clock signal; and
   enabling the one or more components of the electronic device with the reference clock signal.

17. The apparatus of claim 16, wherein the process further comprises: in response to determining the presence of at least one of the one or more spurious frequency components:
   enabling the output of the frequency synthesizer; and
   selecting the second clock signal as the reference clock signal.

\* \* \* \* \*

UNITED STATES PATENT AND TRADEMARK OFFICE
CERTIFICATE OF CORRECTION

| | |
|---|---|
| PATENT NO. | : 11,573,594 B2 |
| APPLICATION NO. | : 17/373322 |
| DATED | : February 7, 2023 |
| INVENTOR(S) | : Norman Beamish et al. |

It is certified that error appears in the above-identified patent and that said Letters Patent is hereby corrected as shown below:

In the Claims

Claim 14, Column 11, Line 13, "ore" should read as --more--.

Signed and Sealed this
Twenty-sixth Day of September, 2023

Katherine Kelly Vidal
*Director of the United States Patent and Trademark Office*